United States Patent [19]

Hemming et al.

[11] Patent Number: 4,661,229
[45] Date of Patent: Apr. 28, 1987

[54] METHOD AND SYSTEM FOR PRODUCING A REACTIVELY SPUTTERED CONDUCTING TRANSPARENT METAL OXIDE FILM ONTO A CONTINUOUS WEB

[75] Inventors: David H. Hemming, Uithoorn; Peter G. Turner, Vinkeveen, both of Netherlands

[73] Assignee: Koninklijke Emballage Industrie Van Leer B.V., Amstelveen, Netherlands

[21] Appl. No.: 738,770

[22] Filed: May 29, 1985

[30] Foreign Application Priority Data

May 29, 1984 [NL] Netherlands ............... 8401721

[51] Int. Cl.$^4$ .............................. C23C 14/00
[52] U.S. Cl. .................. 204/192.13; 204/192.14; 204/192.27; 204/192.15; 204/298
[58] Field of Search ............ 204/192 C, 192 R, 298, 204/192.13, 192.14, 192.15, 192.27

[56] References Cited

U.S. PATENT DOCUMENTS

| | | |
|---|---|---|
| 3,510,374 | 5/1970 | Walker . |
| 3,602,190 | 8/1971 | Kral, Jr. et al. . |
| 3,936,665 | 2/1976 | Donoghue . |
| 4,399,015 | 8/1983 | Endo et al. ............ 204/298 |
| 4,543,576 | 9/1985 | Hieber et al. ............ 204/192 R |

FOREIGN PATENT DOCUMENTS 0082654 12/1982 European Pat. Off. .

OTHER PUBLICATIONS

Maissel et al., IBM Tech. Disc. Bull., vol. 5 (1963), pp. 49–50.
Thornton, Metal Finishing Jan. 1976, pp. 46–51.
Thin Solid Films, vol. 80 (1981) pp. 31–39, M. I. Ridge et al.: The Application of Iron Plating to the Continuous Coating of Flexible Plastic Sheet.
Thin Solid Films, vol. 96 (1982) pp. 121–127, M. I. Ridge et al.: Composition Control in Conducting Oxide Thin Films.

*Primary Examiner*—Arthur P. Demers
*Attorney, Agent, or Firm*—Brumbaugh, Graves, Donohue & Raymond

[57] ABSTRACT

Method for producing a reactively sputtered conducting transparent metal oxide film onto a continuous web moving in a sputtering chamber at a distance past a metal target. The target is arranged in combination with a counterelectrode powered such that a sputtering plasma discharge is generated inside the sputtering chamber transferring metal atoms from the target to the moving web. Oxygen is introduced into said chamber containing a low pressure atmosphere of an inert gas to produce a metal oxide coating. During the sputter process the surface resistance of the coating is continuously monitored at least at two areas across the width of the continuously moving web, whereby the sputtering conditions are controlled such that at least one area exhibits an optimum minimum resistance value.

14 Claims, 10 Drawing Figures

METHOD AND SYSTEM FOR PRODUCING A REACTIVELY SPUTTERED CONDUCTING TRANSPARENT METAL OXIDE FILM ONTO A CONTINUOUS WEB

The invention relates to a method for producing a reactively sputtered conducting transparent metal oxide film onto a continuous web. The continuous web moves in a sputtering chamber at a distance past a metal target, which is in combination with a counterelectrode powered such that a sputtering plasma discharge is generated inside this sputtering chamber transferring metal atoms from the target to the moving web oxygen is introduced into said chamber containing a low pressure inert gas. The invention relates furthermore to a system for carrying out such a method as well as to products thereof.

Transparent conducting oxide coatings having a good visible light transmission of for instance more than 90% and infra-red reflection of for instance over 90% can be used as heat reflecting film in the window pane. Two thirds of the heat transferred by a double pane window is by radiation between the two panes. Suppression thereof can lead to greater gain in performance.

Furthermore the conductivity of these films allows the application thereof in touch control key boards or other touch sensitive contact assemblies and in electronic displays.

Yet another application can be found in the packaging field. The oxide coating, while being transparent, provides a good barrier to water vapour and gases such as oxygen.

Transparent oxide coatings have been made by sputtering the oxide itself, using RF power if the bulk oxide target material is non conducting or by sputtering the metal reactively using DC power in an oxidising atmosphere. These techniques are well established.

Various properties of sputtered oxide coatings such as the electrical conductivity, the transparancy for visible light and the infra-red reflectivity are strongly dependent on the stoichiometry (metal to oxygen ratio) of the coating. Reactively sputtered oxide films of various metals such as indium, cadmium, tin, zinc and alloys and mixtures thereof have been found to be electrically conducting. However, the electrical conductivity is dependent in a non linear way on the ratio of metal to oxygen.

FIG. 1 illustrates the sheet resistivity of an indium-tin oxide (ITO) layer produced in a sputtering chamber containing an argon/oxygen mixture whereby the oxygen flow value was gradually increased from zero to vary the stoichiometry of the produced coating. As appears from FIG. 1 the resistivity first increases from a practically zero value (coating consisting of pure metal) to some maximum value (in this example attained at an oxygen flow of 75 cc/min), drops thereafter sharply to a minimum value and increases then in a steep fashion to very high values.

FIG. 2 illustrates the light transmission for visible light (green light) of the same ITO layer as in FIG. 1 as function of the oxygen flow. As appears from FIG. 2 the light transmission shows a sharp increase starting in this example at approximately 70 cc/min and reaching the maximum value of nearly 100% at ±80 cc/min. It is remarked that corresponding curves for other wave lengths in the visible light area are practically identical with only minor negligible differences with the curve in FIG. 2.

The coatings of interest within the scope of the underlying invention are visibly transparent and electrically highly conducting. It will be clear from FIGS. 1 and 2 that to produce such coatings the stoichiometry of the coating should be controlled very accurately.

If the coating is produced onto a glass surface or another heat resistant surface then the resistivity of the coating can be optimized by a post treatment in either an oxygen rich or an oxygen deficient atmosphere at elevated temperatures.

In their paper "Plasma and film diagnostic techniques during the preparation of sputtered film", M. I. Ridge and R. P. Howson of the Department of Physics, Loughborough University of Technology, have recently described that conducting oxides can be deposited onto plastic films by reactive sputtering of indium, indium-tin or cadmium-tin in argon oxygen mixtures.

Such plastic films cannot withstand a subsequent high temperature post-treatment. Because of this inability to carry out a post treatment Ridge and Howson have already proposed to control the stoichiometry by oxygen flow and on-line measurement of resistance of the coating between two contacts touching the web.

The electrical conductivity of a coating is necessarily proportional to thickness but as appears from FIG. 1 the precise chemical composition of the film i.e. the precise ratio of indium, zinc, tin etc to oxygen has a far larger effect than thickness in determining the conductivity of metal oxide thin films. That implies that small changes either in the oxygen partial pressure, which might arise from fluctuations in the pumping speed or reaction of oxygen, or in metal sputtering rate, which might arise from changes in the oxidation state of the target or erosion of the target surface, can quickly result in an inferior higher resistance coating. It is the electrical conductivity which confers the property of infra-red reflectivity to the coating. For good infra-red reflectivity or in other words for a low emissivity the electrical conductivity should be high i.e. the sheet resistivity should be minimal.

A simple measurement of the resistance across the web as proposed by Ridge and Howson is not enough to obtain an optimum control of the sputtering process since there is no way of knowing whether changes in resistance are the result of too much or too little oxidation, and corrections can only be made by trial and error.

An object of the present invention is now to provide a method and means for controlling this sputtering process, in particular a (planar) magnetron sputtering process, to maintain optimum (minimum) resistivity of the oxide coating continuously.

In agreement with said object the invention now provides a method for producing a reactively sputtered conducting transparent metal oxide film onto a continuous web moving in a sputtering chamber at a distance past a metal target. The target is arranged in combination with a counterelectrode powered such that a sputtering plasma discharge is generated inside this sputtering chamber transferring metal atoms from the target to the moving web oxygen is introduced into said chamber containing a low pressure inert gas to produce a metal oxide coating according to the invention, the surface resistance of the coating is continuously monitored at least at two areas across the width of the continuously moving web, and the sputtering conditions are controlled such that at least one area exhibits an optimum resistance value.

In this method according to the invention, use is made of the inevitable minor variations in stoichiometry across the width of the web. (In the unlikely event of no such variations being present, a small variation can be deliberately set up by modifying gas inlets or by making minor adjustments in the geometry of the target to substrate positioning.) Because of these variations a situation can be created in which the resistivity in one of for instance three areas is exactly at a minimum, the resistivity in a second area is higher, defined by a point in the resistivity curve before said minimum and the resistivity in a third area is also higher, defined by a point in the resistivity curve after said minimum. Shifting of the resistivity of said one area away from the exact minimum will result in a change in the respective resistivity values of the second and third areas whereby the shift direction is indicated by the nature of said change, i.e. decrease or increase, providing the possibility to correct said change. Thus by re-adjusting the sputtering conditions the whole process can be controlled such that the resistivity in the first mentioned area is maintained exactly at the optimum (minimum) value.

Both U.S. Pat. Nos. 3,510,374 and 3,936,665 describe a system for regulating an apparatus, such as a calender, in which a specific material property is measured by one or more gauges and the measured values are compared with a predetermined target value to determine if any adjustment of the apparatus is necessary to obtain a material with an optimum specific property.

This prior art systems is, however, destined to measure more or less linearly varying material properties of which the optimum value is known in an absolute sense. However, the method according to the invention is required to operate on non-linearly varying properties such that said property is maintained in a region of a minimum. A unique feature of the inventive method is the use or, if necessary the introduction, of minor varations across the width of the sputtered film.

In further contrast with the prior art the readings of the resistance measuring sensors according to the invention are compared with each other and the result of said comparison is used to control the sputtering conditions to optimize the stoechiometry of the coating.

In a preferred embodiment of this method according to the invention the sputtering conditions are controlled by regulating the power supplied to the sputtering target combination.

Another preferred embodiment of the method is characterized in that the sputtering conditions are controlled by varying the amount of supplied oxygen.

Controlling the power supplied to the target has an influence on the metal flow from the target to the continuously running web. A disadvantage thereof might be that a varying metal flow results in variations of the coating thickness. Where a coating of accurately constant thickness has to be produced, then the transport mechanism transporting the continuous web past the metal target has to be controlled simultaneously with the power supply regulation. In practice however these thickness variations will be negligible.

Controlling the amount of supplied oxygen results in a coating of equal thickness. The transmissivity of these coatings might show very small variations, but these variations in practise however are hardly measurable and certainly negligible.

To make the delay time in the control loop as short as possible the surface resistance is preferably measured immediately after the coating zone.

The invention furthermore provides a system for carrying out a method for producing a reactively sputtered conducting transparent metal oxide film of the type described above, comprising a sputtering chamber, an electrical power supply for generating a plasma discharge in said chamber between the metal target and the counterelectrode, inert gas supply means, oxygen supply means and means for moving the continuous web through the coating zone over the metal target. In the system according to the invention, the surface resistance of at least two areas across the width of the continuously moving web is monitored in each of said areas by means of resistance measuring devices connected to respective resistance measuring circuits. One such measuring device or sensor comprises a number of probes, which are in a known way used to measure the surface resistance of the coating in the respective areas.

A preferred embodiment of the system according to the invention is characterized by a series of equally spaced probes covering with equal mutual spacing the complete width of the web and connected to a multiplexer with a plurality of outputs connected to a resistance measuring circuit. The multiplexer is controlled such that periodically the signals of groups of selected probes are delivered to said measuring circuit. This embodiment gives the user a large freedom in the selection, and the possibility to periodically change to other groups of probes as well as the possibility to use groups of probes with different mutual spacing.

Preferably a processor receives the measured resistance values and provides a control signal either to the power supply to the cathode or to the oxygen flow to the chamber such that the optimum coatings are maintained.

In the following description the invention will be explained in more detail with reference to the accompanying drawings in which FIG. 1 illustrates the sheet resistivity of an ITO coating as a function of the oxygen flow;

Figure 1:
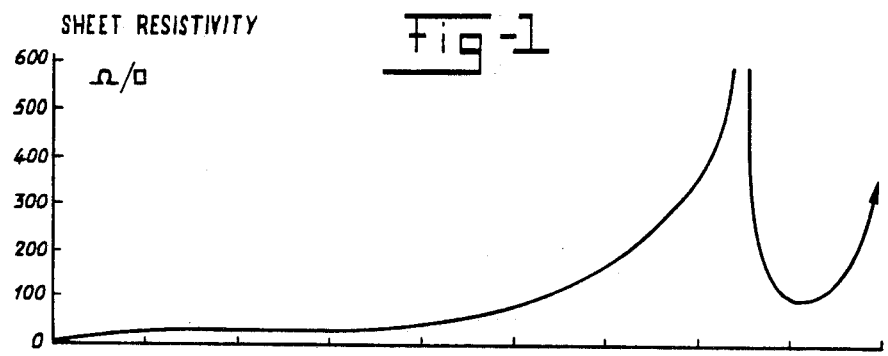
Figure 2:
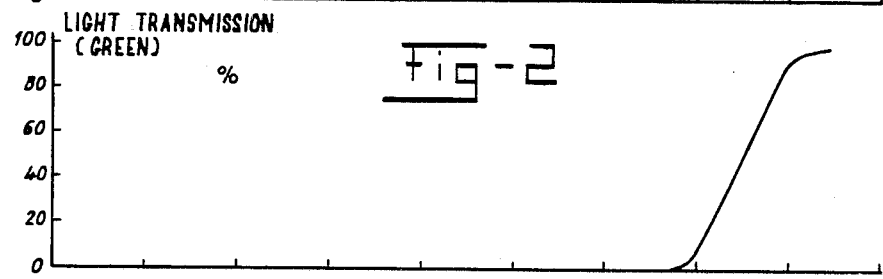
FIG. 2 illustrates the visible light transmission through an ITO coating as a function of the oxygen flow.
Figure 3:
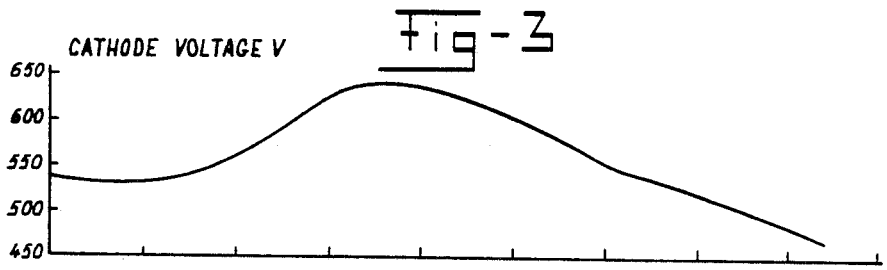
FIG. 3 illustrates the cathode voltage as a function of the oxygen flow during the ITO coating process.
Figure 4:
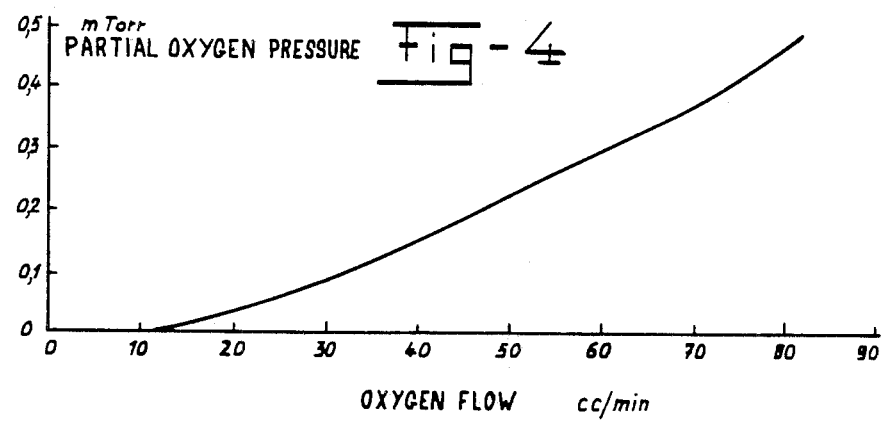
FIG. 4 illustrates the oxygen partial pressure as a function of the oxygen flow during the ITO coating process.

FIG. 1 illustrates the sheet resistivity as a function of the oxygen flow. Starting with pure argon inside the sputtering chamber the resulting unoxidized metal coating will have a very low resistivity of about 10Ω/□. The coating is bright metal and very soft. With increasing oxygen flow the resistivity will increase but, as appears from FIG. 2, still the light transmission is practically zero. If in this example the oxygen partial pressure is increased to somewhat above 0.4, which assuming an argon flow of 200 cm/min (argon pressure 5.2 mT) corresponds to an oxygen flow between 70 and 75 cc/min, then the resistivity shows a sharp increase and rises to approximately 100,000Ω/□. As appears from FIG. 2 the coating is already partly transparent in this region. Thereafter with further increase of the oxygen flow the resistivity decreases sharply and reaches a minimum of about 100Ω/□ and simultaneously the coating becomes a hard glossy oxide which is fully transparent to visible light. Further increase of the oxygen flow results in excessive oxidation and the coating in that region is, although transparent a bad conductor having an increased resistivity and therefore a decreased infrared reflectivity as will be clear from FIG. 1.

It appears from these figures that the optimum condition in the sputtering process is reached in this example with an oxygen partial pressure of 0.5, which with an argon flow of 200 cc/min and argon pressure of 3.2 mT, corresponds to an oxygen flow of about 90 cc/min. The cathode voltage was stabilized under these circumstances at about 475 V.

The FIGS. 1 to 4 relate to an example of an ITO oxide coating. The fully oxidised thin ITO films are totally transparent in the visible part of the spectrum. Incomplete oxidation shows itself as strong absorption at the blue end of the spectrum giving the films a brown appearance. Otherwise the only colouration of the thin film is that resulting from thin film interference effects visible both in transmission and reflection. The magnitude of such effects is a function of the refractive index n of the film relative to that of the substrate (polyester film n=1.7). The colour is a function of the product of refractive index and thickness.

Figure 5:
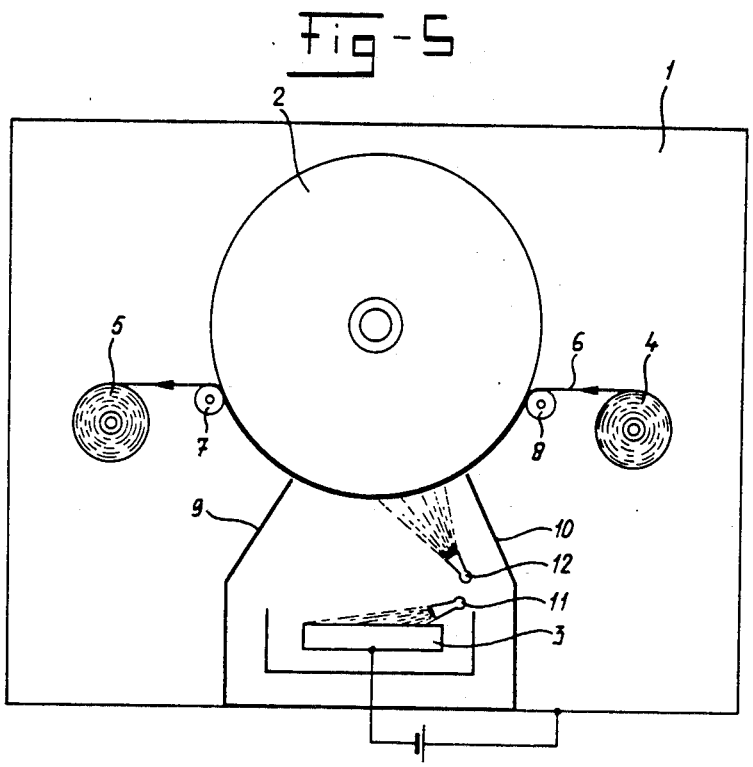
FIG. 5 illustrates in a very schematical way the sputtering apparatus used for carrying out the method according to the invention.

FIG. 5 illustrates very schematically the system for producing a conducting transparent metal oxide film on a moving web. A target 3 connected as cathode and a chill drum 2 are positioned into a sputtering chamber which is schematically indicated by 1. The continuous web 6 is transported between a wind-off roller 4 and a wind-on roller 5. The web 6 is moving over a distance between the guiding rolls 7 and 8 in contact with the rotating drum 2. Between the shields 9 and 10 the web is exposed to the target 3, connected as cathode to a power source which is not illustrated in the figure. Above the target plate 3 a flow of argon is supplied through the flow nozzle 11 and a flow of oxygen is directed onto the moving web by an oxygen nozzle 12. The means for evacuating the sputtering chamber, for controlling the argon flow and oxygen flow, the various electrical connections, etc are not shown in this figure.

Figure 6:
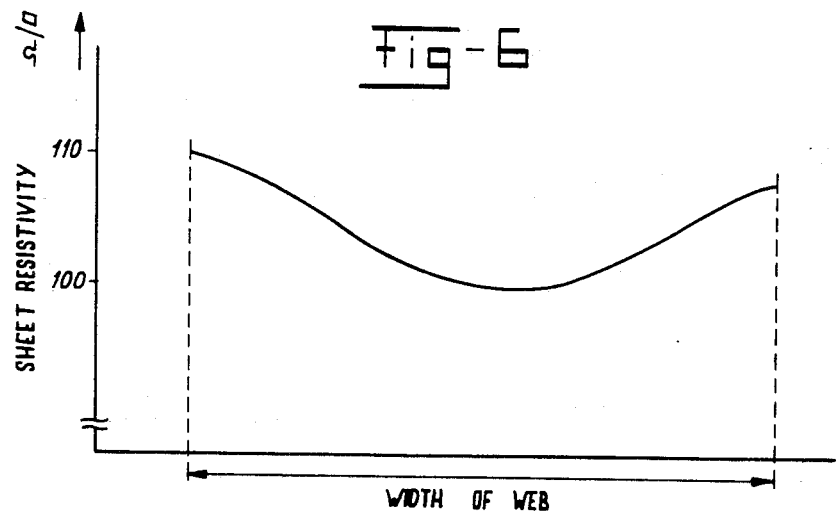
FIG. 6 illustrates an example of a possible resistivity profile across the width of the running web.
Figure 7:
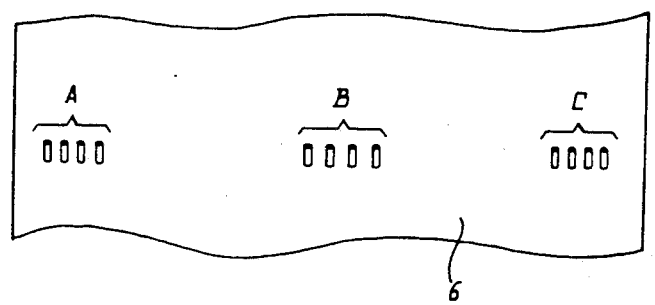
FIG. 7 illustrates three four point probes positioned onto the running web and measuring the resistivity in three different areas across the width of the web.
Figure 8:
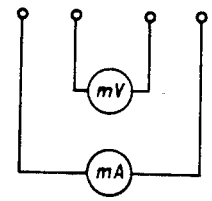
FIG. 8 illustrates the way in which the four probes of each sensor are used to determine the surface resistivity.

FIG. 6 illustrates a possibile resistivity profile measured along the width of the web. In FIG. 6 the centre area of the web has a minimum resistivity of about 100Ω/□ whereas the resistivity increases in the direction of the web sides and reaches a value of about 110Ω/□. According to the invention use is now made of this restitivity profile by positioning for example three four-point-probes onto three different areas of the web such as is schematically indicated in FIG. 7. Each set of the probes A, B and C is connected to a resistance measuring circuit embodied as schematically indicated in FIG. 8. As is known to the expert for equally spaced probes the resistivity can be calculated as Ω/□=4.53×mV/mA.

The process is started by sputtering at the required power, whereby initially only argon is supplied and progressively oxygen is added. The resistance readings from the three sensors A, B and C are continuously monitored, for instance using meters, or using a recorder. Each sensor will give an output and based on the combination of the outputs it is possible to flow the resistivity curve of FIG. 1. Because of inevitable minor differences in conditions across the web, as for instance is indicated in FIG. 6, as the coating approaches the condition of minimum resistivity the output from one sensor will pass through the minimum ahead of the other two, and one will lag behind. The conditions for sputtering an optimum coating onto the continuous running web are achieved when in this example the middle sensor provides a minimum resistance output and the other two provide approximately equal outputs, one having passed through the minimum and the other not having passed through the minimum.

Figure 9:
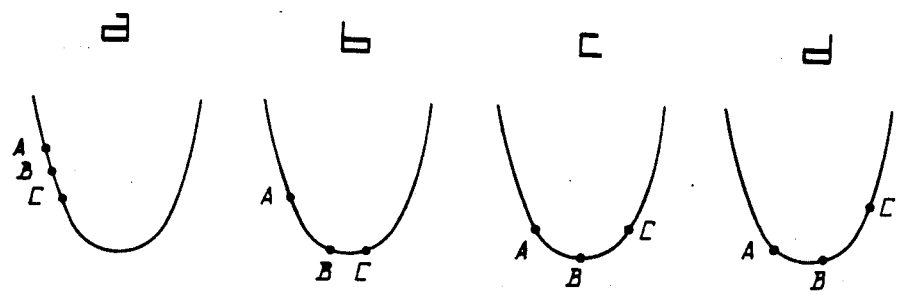
FIG. 9 illustrates schematically the effect of the oxygen flow control or power supply regulation using a system according to the invention.

FIG. 9 shows a number of situations that can occur.

FIG. 9a illustrates the situation during the approach to the optimum sputtering process in which the resistance sensors A, B and C are all measuring a too high resistivity.

FIG. 9b illustrates the situation in which the sensor C has passed the minimum in the resistivity curve and sensor B is approaching this minimum.

In FIG. 9c the optimum situation is reached. The sensor B, the centre probe in the assumed example, is exactly at minimum and the other probes are measuring resistivity values at both sides thereof.

FIG. 9d illustrates a situation with slight over-oxidation.

It is also possible to use an embodiment in which the resistivity in only two areas across the width of the continuously moving web is monitored. This situation will be obtained if in FIG. 7 for instance only the sensors A and C are used. Also in this case the process is started by sputtering at the required power, whereby initially only argon is supplied and progressively oxygen is added. As the amount of oxygen is increased the readings of both sensors A and C will steadily rise until the maximum resistance whereafter measured resistance values will descrease. Because of the already mentioned inevitable minor differences in conditions across the web one of the sensors will pass the point of minimum resistivity ahead of the other. The optimum sputter conditions are reached when only one resistance sensor has bassed through the point of minimum resistivity and its increasing resistivity matches the falling resistivity shown by th other sensor. Drifting from the optimum condition results into a variation of both measured resistance values such that the directions of variation are indicative for the drift direction. Reference is made to FIG. 9c. Drifting of the conditions to overoxidation results into a movement of point A downwards and of point C upwards. Drifting to a condition of underoxidation results into a movement of point A upwards and of point C downwards.

It is remarked that the position of the two or three (or even more) resistance sensors is not limited to the positions suggested in FIG. 7. Unsymmetrical or arbitrary configurations can also be used.

Figure 10:
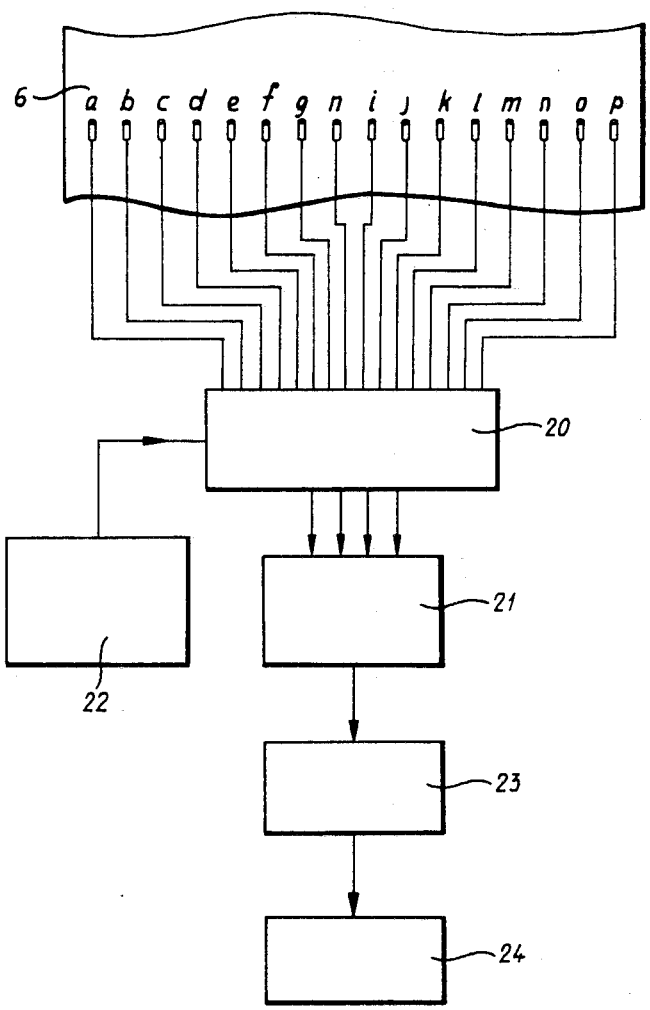
FIG. 10 illustrates a control system combined with another configuration of resistivity measuring sensors.

FIG. 10 illustrates another embodiment of the resistance measuring means comprising the probes a . . . p. Said probes are connected to a multiplexer 20 with a corresponding number of inputs and four outputs. Said multiplexer 20 is controlled by a controller 22 such that sequentially four selected probes are connected through the multiplexer 20 to the resistance measuring circuit 21. If a comparison is made with FIG. 7 then sequentially for instance the probes a, b, c, d, thereafter g, h, i, j and thereafter m, n, o, p can be connected through the multiplexer 20 to the resistance measuring circuit 21. The resistance measuring circuit 21 delivers the measured resistance values to the controller 23 in which with reference to FIG. 9b, c and d, it is determined if the oxygen flow has the correct value, if the supplied amount of oxygen has to be decreased or increased, and the controller 23 thereafter delivers a control signal to the oxygen supply means 24 to maintain the whole process in the optimum condition.

It will be clear that instead of the oxygen supply means 24 also the electrical power generating means can be controlled or a combination of both means can be controlled.

In this embodiment it is furthermore possible to use other combinations of sensors, for instance first the probes a, c, e, g, thereafter the probes e, g, i, k and thereafter the probes j, l, n, p as four-point-probes for measuring respective resistivity values.

Furthermore it is possible to locate the probe at different areas for instance in case the resistivity profile is not as illustrated in FIG. 6 but is shaped according to another curve. It is conceivable that the central part of the web has a little over-oxidation, that there are at both sides of the actual central area two regions which have the actual minimum resistivity and that the resistivity in the direction of both sides increases again. Such a curve can be defined using 5 different sensors. Also in that situation the proper sensors can be selected by means of the configuration of FIG. 10 or separate probes as in FIG. 7 can be located at the proper positions.

It is furthermore remarked that instead of the above mentioned sensors with probes of the contacting type also non contacting sensors can be used, in which case any possible damage to the oxide layer, which might be caused by the probes which are in contact with said oxide layer, will be avoided. These contactless resistance measuring sensors are considered as known to the expert and will therefore not be described in detail.

We claim:

1. A method for producing a reactively sputtered conducting transparent metal oxide film on a continuous web comprising
    (a) moving the continuous web between a metal target and a counterelectrode within a sputtering chamber;
    (b) generating a sputtering discharge within the sputtering chamber causing metal atoms to be transferred to the continuous web;
    (c) introducing an oxygen flow to the sputtering chamber such that a metal oxide coating is produced on the continuous web;
    (d) monitoring the surface resistance of the metal oxide coating at least at two areas across the width of the continuous web, said areas differing in extent of oxidation of the metal oxide coating;
    (e) varying the reactive sputtering conditions such that the resistance measured at a first area of the continuous web is observed to increase after passing through an optimum minimum resistance value, while the resistance measured at a second area is still decreasing towards said minimum value;
    (f) comparing the surface resistance values of said first and second areas; and
    (g) controlling the sputtering conditions such that the surface resistances of said first and second areas are maintained at approximately equal values.

2. A method according to claim 1, wherein the sputtering conditions are controlled by varying the sputtering plasma discharge.

3. A method according to claim 1, wherein the sputtering conditions are controlled by varying the oxygen flow to the sputtering chamber.

4. A method according to claim 1, wherein the surface resistance is monitored at a point immediately after the coating zone.

5. A method according to claim 1, wherein a magnetron sputtering process is used.

6. A method according to claim 1, wherein the surface resistance is measured at three areas across the width of the web, and wherein the sputtering conditions are controlled by maintaining the surface resistance of two areas at approximately equal values, while the resistance of a third area is maintained at an optimum minimum value.

7. A method for controlling the characteristics of a metal oxide coating during deposition of the coating by reactive sputtering into a continuous web, comprising
    (a) measuring the resistance of the coating being formed at least at two areas across the width of the continuous web;
    (b) varying the reactive sputtering conditions such that the resistance measured at a first area of the continuous web is observed to increase after passing through an optimum minimum resistance value, while the resistance measured at a second area is still decreasing towards said minimum value; and
    (c) controlling the reactive sputtering conditions such that resistance measured in said first and second areas remains essentially the same, whereby optimum resistivity and transmissivity of the metal oxide film are maintained.

8. A method according to claim 7, wherein resistance is also measured at a third area of the continuous web and the reactive sputtering conditions are controlled such that the resistance of said third area is maintained at a minimum value.

9. A method according to claim 7 or 8 wherein the reactive sputtering conditions are controlled by varying oxygen flow.

10. An apparatus for producing a transparent conductive metal oxide film on a continuous web by reactive sputtering, comprising
    (a) a sputtering chamber;
    (b) a metal target and a counterelectrode arranged within the sputtering chamber such that when power is supplied a plasma discharge is formed between the metal target and the counterelectrode;
    (c) means for supplying inert gas to the sputtering chamber;
    (d) means for supplying oxygen to the sputtering chamber;
    (e) means for moving a continuous web through a coating zone located above the metal target;
    (f) means for measuring the surface resistance of the film at least at two areas across the width of the continuous web; and
    (g) means for comparing the measured surface resistance and providing a signal to control the sputtering conditions such that measured dresistances are maintained at a value near an optimum minimum value.

11. An apparatus according to claim 10, wherein the resistance measuring means comprises a plurality of sensors.

12. An apparatus according to claim 11, wherein the sensors are equally spaced across the entire width of the continuous web and are connected to a multiplexer with four outputs connected to a resistance measuring circuit, said multiplexer being controlled such that periodically the signals of four of the sensors are delivered to the measuring circuit to provide a resistance measurement for a particular area.

13. An apparatus according to claim 10, wherein the resistance values are maintained by controlling the plasma discharge.

14. An apparatus according to claim 10, wherein the resistance values are maintained by controlling the plasma discharge.

* * * * *